US009985230B2

(12) United States Patent
Chen et al.

(10) Patent No.: US 9,985,230 B2
(45) Date of Patent: May 29, 2018

(54) FLUORINE-MODIFICATION PROCESS AND APPLICATIONS THEREOF

(71) Applicant: ACADEMIA SINICA, Taipei (TW)

(72) Inventors: Kuei-Hsien Chen, Taipei (TW);
Hsieh-Cheng Han, Taipei (TW);
Ching-Chun Chang, Taipei (TW);
Li-Chyong Chen, Taipei (TW);
Chan-Yi Du, Taipei (TW)

(73) Assignee: ACADEMIA SINICA, Taipei (TW)

( * ) Notice: Subject to any disclaimer, the term of this patent is extended or adjusted under 35 U.S.C. 154(b) by 368 days.

(21) Appl. No.: 14/824,580

(22) Filed: Aug. 12, 2015

(65) Prior Publication Data

US 2015/0372247 A1    Dec. 24, 2015

Related U.S. Application Data

(62) Division of application No. 13/494,888, filed on Jun. 12, 2012, now abandoned.

(51) Int. Cl.
*H01L 51/50* (2006.01)
*H01L 51/42* (2006.01)
*H01L 51/44* (2006.01)
*H01L 51/00* (2006.01)

(52) U.S. Cl.
CPC ........ *H01L 51/424* (2013.01); *H01L 51/4246* (2013.01); *H01L 51/44* (2013.01); *H01L 51/005* (2013.01); *H01L 51/0036* (2013.01); *H01L 51/0043* (2013.01); *H01L 51/0046* (2013.01); *H01L 51/0047* (2013.01); *H01L 51/0055* (2013.01); *Y02E 10/549* (2013.01)

(58) Field of Classification Search
None
See application file for complete search history.

(56) References Cited

U.S. PATENT DOCUMENTS

| 8,136,922 | B2 | 3/2012 | Wu et al. |
|---|---|---|---|
| 2003/0175552 | A1 | 9/2003 | Imamura et al. |
| 2008/0286604 | A1 | 11/2008 | Inoue et al. |
| 2009/0206740 | A1 | 8/2009 | Chun et al. |
| 2011/0037027 | A1* | 2/2011 | Stoessel ............. C07C 13/567 252/301.16 |

(Continued)

FOREIGN PATENT DOCUMENTS

WO    WO 2012/002463 A1    1/2012

OTHER PUBLICATIONS

Chang et al., "Effects of cathode buffer layers on the efficiency of bulk-heterojunction solar cells", Applied Physics Letters, vol. 96, 2010, 3 pages provided.

(Continued)

*Primary Examiner* — Gregory D Clark
(74) *Attorney, Agent, or Firm* — Birch, Stewart, Kolasch & Birch, LLP

(57) ABSTRACT

The present invention is related to a process for reducing surface energy of a hole transport layer. The disclosed process comprises providing a hole transport layer; and providing a fluorine-containing layer directly on said hole transport layer. The configuration of said fluorine-containing layer reduces the structural disorder of an active layer and is able to recover a moisture-degraded hole transport layer, and thereby improves the performance of an electric device containing the same.

12 Claims, 7 Drawing Sheets

(56) References Cited

U.S. PATENT DOCUMENTS

| | | |
|---|---|---|
| 2011/0227107 A1 | 9/2011 | Kondo et al. |
| 2011/0288241 A1 | 11/2011 | Oh et al. |
| 2012/0049164 A1 | 3/2012 | Inbasekaran et al. |
| 2013/0015424 A1 | 1/2013 | Chung et al. |
| 2013/0026415 A1 | 1/2013 | James et al. |
| 2013/0092238 A1 | 4/2013 | Ogata et al. |

OTHER PUBLICATIONS

Cheyns et al., "Stacked organic solar cells based on pentacene and C60", Solar Energy Materials & Solar Cells, vol. 91, 2007, pp. 399-404.

Gundlach et al., "Pentacene Organic Thin-Film Transistors—Molecular Ordering and Mobility", IEEE Electron Device Letters, vol. 18, No. 3, Mar. 1997, pp. 87-89.

Hains et al., "Anode Interfacial Tuning via Electron-Blocking/Hole-Transport Layers and Indium Tin Oxide Surface Treatment in Bulk-Heterojunction Organic Photovoltaic Cells", Advanced Functional Materials, vol. 20, 2010, pp. 595-606.

Hong et al., "Reducing the contact resistance in organic thin-film transistors by introducing a PEDOT:PSS hole-injection layer", Organic Electronics, vol. 9, 2008, pp. 864-868.

Horowitz et al., "Gate voltage dependent mobility of oligothiophene field-effect transistors", Journal of Applied Physics, vol. 85, No. 6, Mar. 15, 1999, pp. 3202-3206.

Ishii et al., "Energy Level Alignment and Interfacial Electronic Structures at Organic/Metal and Organic/Organic Interfaces", Advanced Materials, vol. 11, No. 8, 1999, pp. 605-625.

Kippelen et al., "Organic Photovoltaics", Energy & Environmental Science, vol. 2, No. 3, Mar. 2009, pp. 251-261.

Wang et al., "Multiple roles of bathocuproine employed as a buffer-layer in organic light-emitting diodes", Applied Surface Science, vol. 252, 2006, pp. 2355-2359.

Yang et al., "Effects of thin film processing on pentacene/C60 bilayer solar cell performance", Organic Electronics, vol. 8, 2007, pp. 566-574.

\* cited by examiner

FLUORINE-MODIFICATION PROCESS AND APPLICATIONS THEREOF

CROSS REFERENCE TO RELATED APPLICATIONS

This application is a Divisional of U.S. patent application Ser. No. 13/494,888, filed Jun. 12, 2012, which is incorporated herein by reference.

FIELD OF THE INVENTION

The present invention is related to the improvement of power conversion efficiency for an electronic device; more specifically to the improvement of power conversion efficiency for an organic solar cell.

DESCRIPTION OF THE PRIOR ART

Organic solar cells (OSC) have attracted much attention during the recent decades. Compared to the conventional photovoltaic devices, the organic solar cells have advantageous in low-cost fabrication and flexibility.

In an organic solar cell, excitons are generated by photoexcitation of an organic solid. The active materials at OSC, in their corresponding donor/acceptor phases, provide the driving force for the exciton dissociation into charge carriers at the interfaces. The two phases must form bi-continuous networks for efficient excitons diffusion and charge separation. The recombination of charge carriers can also hinder the separation process and hence reduce the power conversion efficiency (PCE). Literatures have shown that the lower molecular doping could reduce the interfacial recombination and improve the OSCs performances greatly. The structure order or dipoles at the interface would also enhance the charge-separation rate.

The separated charge carriers will be transported efficiently through the donor and acceptor layers and collected by the corresponding electrodes. It had been reported that the PCE of the devices with a highly ordered bulk hetero-interface could be largely increased by high carrier-transport efficiency. Selective control of doping and band-edge energies with minimal mid-gap states could optimize the carrier transporting and collecting efficiencies. Besides, the modifications out for both contacts, balancing the rates of hole and electron collection, could elevate the overall efficiencies.

Interface engineering between the anode and the active layer is important for the device lifetime as well as power conversion efficiency in solar cells. For instance, hole-injecting conducting polymer films such as poly(3,4-ethylenedioxythiophene) (PEDOT) on indium tin oxide (ITO) play important roles in determining the device efficiency and stability, because of improving in carrier transporting properties at the ITO/active materials interfaces and also the planarization of the ITO surface.

On the other hand, it is known that the morphology of the P-layer of an active layer in an OSC structure also has significant impact on the performance thereof. In a pentacene-based OSC, the general morphology of pentacene thin film is comprised by mixed crystalline domains (grains) with dendritic structures and isolated fiber-like features. The coexistence of the long-axis oriented dendrite-like domains (perpendicular to the substrate) and the fiber-like structures lying flat on the substrate leads to high degree of structural disorder. Such structural disorder has been reported for degrading the electrical performances of devices, attributed to the trap states existed at the grain boundaries.

Moreover, the device lifetime is an important issue for OSC applications. The degradation of device performance may be caused by the absorbed moisture during the manufacture and/or the operation of the OSC. Therefore, during the manufacture process, the configuration or deposition of elements of an OSC, especially a hole transport layer (ex. a PEDOT:PSS layer), is generally necessary to be conducted in a glove box with a limited moisture. Besides, some may configure water absorbing agents inside the package of an OSC to prevent moisture in the OSC structure, and thereby to prolong the lifetime thereof. However, to operate the manufacture process in a glove box not only raises the manufacturing cost but also hinders mass production for commercialization of OSC. In addition, configuring water absorbing agents may also result in additional manufacture cost.

To sum up, there are several factors/problems known to be important to the performance and commercialization of OSCs; however, those factors/problems still need to be clarified or solved. Therefore, an OSC with better power conversion efficiency is continued required in this filed.

SUMMARY OF THE INVENTION

In view of the foregoing, one object of the present invention is to increase the power conversion efficiency of an OSC by decreasing the structural disorder of the active layer thereof.

Another object of the present invention is to improve the long term stability of an OSC by decreasing the absorbed moisture in the OSC structure.

To achieve the above objects, the present invention provides a process for reducing surface energy of a hole transport layer, comprising the following steps: providing a hole transport layer; and providing a fluorine-containing layer directly on said hole transport layer.

The present invention also provides a process for recovering a moisture-degraded hole transport layer, comprising the following steps: obtaining a moisture-degraded hole transport layer; and providing a fluorine-containing layer directly on said moisture-degraded hole transport layer.

The present invention also provides a process for manufacturing an electronic device, comprising the following steps: providing a substrate coated with a conductive material as a anode; providing a hole transport layer on said substrate; providing a fluorine-containing layer directly on said hole transport layer; providing an active layer directly on said fluorine-containing layer; providing an electron transport layer on said active layer; and providing an cathode on said electron transport layer.

The present invention further provides an electronic device, comprising electric-connected layers in order: a anode; a hole transport layer; a fluorine-containing layer, which is deposited directly on said hole transport layer; an active layer, which is deposited directly on said fluorine-containing layer, an electron transport layer; and an cathode.

Preferably, said providing said fluorine-containing layer comprising the following steps: obtaining a liquid by dissolving a fluorine-containing material in a solvent; and depositing said liquid on said hole transport layer.

Preferably, said liquid comprises: 0.01~10 volume percentage concentration of said fluorine-containing material; wherein said volume percentage concentration is based on the total volume of said solvent.

Preferably, said solvent comprises chlorobenzene, ethanol, water, or a mixture thereof.

Preferably, said fluorine-containing material comprises fluorocarbon, silane derives thereof, or a mixture thereof.

Preferably, said silane derives of fluorocarbon comprises polyfluoroalkoxysilane.

Preferably, said polyfluoroalkoxysilane comprises (heptadecafluoro-1,1,2,2-tetra-hydrodecyl)trimethoxysilane, and a mixture thereof.

Preferably, said fluorocarbon comprises perfluorononane.

Preferably, said process for reducing surface energy of a hole transport layer, said process for recovering a moisture-degraded hole transport layer and/or said process for manufacturing an electronic device further comprises a heating step of heating said fluorine-containing layer at a temperature of 50~300° C.

Preferably, said heating step is conducted by thermal treatment, microwave treatment, or a combination thereof.

Preferably, said hole transport layer and/or said moisture-degraded hole transport layer comprises polyethylenedioxythiophene, polystyrenesulfonate, polyaniline, polyphenylenevinylene, TPD, NPB, or a mixture thereof. More preferably, said hole transport layer and/or said moisture-degraded hole transport layer is a polyethylenedioxythiophene:polystyrenesulfonate layer (a PEDOT:PSS layer).

Preferably, said process for reducing surface energy of a hole transport layer, said process for recovering a moisture-degraded hole transport layer and/or said process for manufacturing an electronic device is conducted at atmosphere.

Preferably, said conductive material comprises conductive metal oxide, conductive polymer, or a mixture thereof. Preferably, said conductive metal oxide comprises indium tin oxide (ITO), indium zinc oxide (IZO), antimony tin oxide (ATO), fluorine doped tin dioxide (FTO), aluminum doped zinc oxide (AZO), gallium doped zinc oxide (GZO), or a mixture thereof.

Preferably, said active layer comprises a P-layer and a N-layer.

Preferably, said P-layer comprises pentacene, rubrene, tetracene, phthalocyanine, derives thereof, or a mixture thereof. Preferably, said N-layer comprises C60, C70, derives thereof, or a mixture thereof. More preferably, said P-layer is a pentacene layer and said N-layer is a C60 layer.

Preferably, said active layer comprises a mixture of poly (3-hexylthiophene) and [6,6]-phenyl C61-butyric acid methyl ester (a mixture of P3HT and PCBM). More preferably, said active layer is a P3HT:PCBM layer.

Preferably, said electron transport layer comprises bathocuproine (BCP), tris(8-hydroxy-quinolinato)aluminum (Alq3), or a mixture thereof.

Preferably, said hole transport layer of said electronic device has a surface energy of 7~65 (mJ/m$^2$).

Preferably, said active layer of said electronic device comprises a P-layer and a N-layer; wherein said P-layer directly contacts with said fluorine-containing layer. More preferably, said P-layer is a pentacene layer and said N-layer is a C60 layer.

Preferably, said pentacene layer of said electronic device has no fiber-like grain.

Preferably, said pentacene layer of said electronic device has a diffraction pattern as shown in FIG. 3b.

Preferably, said electronic device has an open-circuit voltage (Voc) of 0.2~0.8 V.

Preferably, said electronic device is a solar cell, a thin film transistor, or a light emitting diode.

To sum up, the present invention teaches a process to modify a hole transport layer by providing a fluorine-containing layer directly contacting with said hole transport layer. The modification results in low surface energy of said hole transport layer, and thereby improves the molecular orientation of an active layer in an electronic device such as a solar cell. On the other hand, the low surface energy of said hole transport layer gives a high hydrophobic property for the same; therefore said hole transport layer is protected from moisture-degradation.

Furthermore, the applicant surprisingly realized that the modification by providing a fluorine-containing layer can recover a moisture-degraded hole transport layer to its operable status. In addition, the applicant also found that a solar cell with a fluorine-containing layer according to the present invention has a high open-circuit voltage (Voc) than conventional ones.

DESCRIPTION OF THE PREFERRED EMBODIMENTS

The present invention basically discloses a process for modifying a hole transport layer by providing a fluorine-containing layer directly contacting with said hole transport layer.

The term "providing" in providing a fluorine-containing layer refers to any manner to configure a fluorine-containing layer on a desired surface. Preferably, said fluorine-containing layer can be configured by deposition including but not limited to spin coating, thermal evaporation, thermal pyrolysis, dip coating vapor deposition, plasma treatment.

Figure 1:
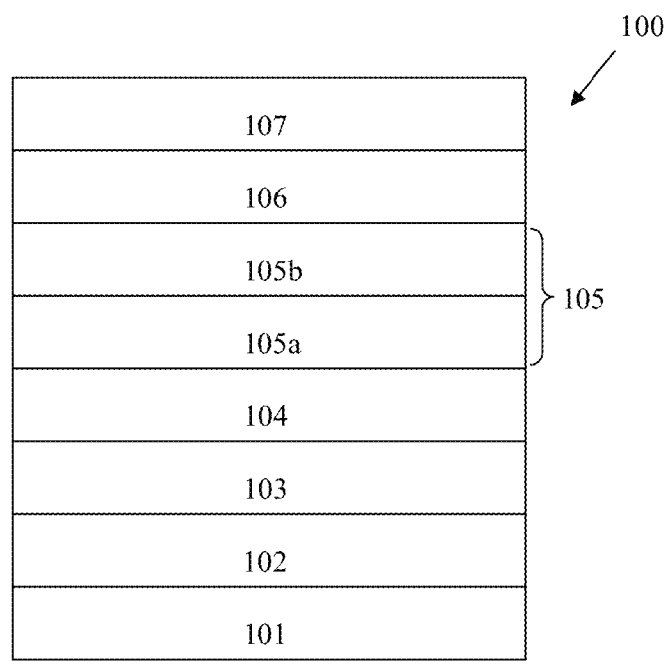
FIG. 1 shows a simplified diagram of a layer structure of an electronic device manufactured according to the process of the present invention
Figure 2:
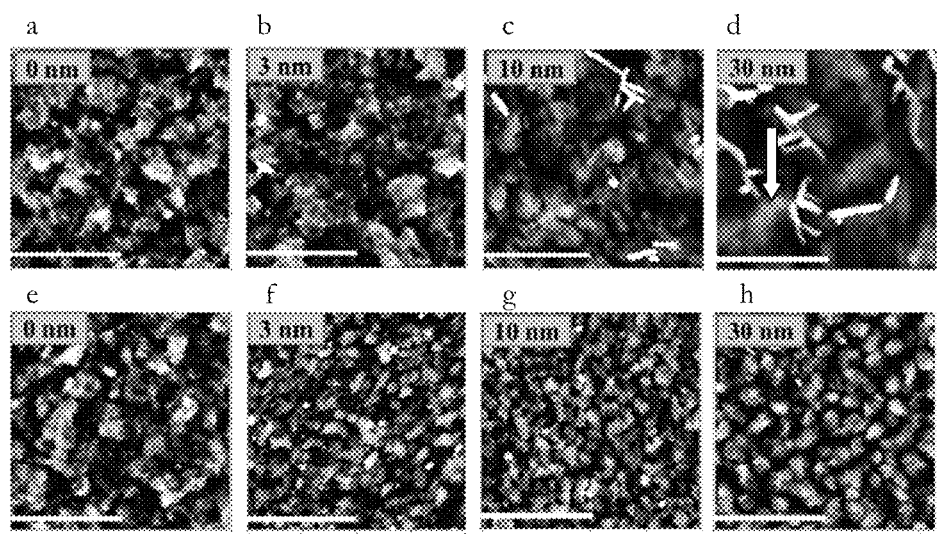
FIG. 2 shows AFM observation result of a pentacene layer of a convention OSC structure of 0 nm (a), 3 nm (b), 10 m, (c) and 30 nm (d) thickness and a pentacene layer of an OSC structure according to the present invention of nm (e), 3 nm (f), 10 m, (g) and 30 nm (h) thickness.

Please refer to FIG. 1, which shows a simplified diagram of a layer structure of an electronic device 100 manufactured according to the process of the present invention. The electronic device 100 has a substrate 101, a conductive layer 102 as a anode, a hole transport layer 103, a fluorine-containing layer 104, an active layer 105, an electron transport layer 106, and an cathode 107. The layer structure can be made by sequentially depositing the aforesaid layers in order. The depositing method includes but not limits to spin coating, thermal evaporation, thermal pyrolysis, dip coating vapor deposition, plasma treatment.

Said substrate 101 can be made of a hard material or a flexible material. Preferably, said substrate 101 is made of a transparent material. More preferably, said substrate 101 is made of a material having a visible light transmittance of no less than 70%. In an alternative embodiment, said substrate 101 is made of glass.

Said conductive layer 102 is made by coating a conductive material on said substrate 101. Said conductive material comprises conductive metal oxide, conductive polymer, or a mixture thereof. Said conductive metal oxide includes but not limits to indium tin oxide (ITO), indium zinc oxide (IZO), antimony tin oxide (ATO), fluorine doped tin dioxide (FTO), aluminum doped zinc oxide (AZO), gallium doped zinc oxide (GZO), or a mixture thereof. In an alternative embodiment, said conductive material is ITO.

Said hole transport layer 103 may comprise materials such as polyethylenedioxythiophene (PEDOT), polystyrenesulfonate (PSS), polyaniline, polyphenylenevinylene, TPD, NPB, or a mixture thereof. In an alternative embodiment, said hole transport layer 103 is a PEDOT:PSS layer.

Said fluorine-containing layer 104 may comprise fluorine-containing material. Preferably, said fluorine-containing material is a fluorine-containing material having hydrophobic linear structure with high electron-affinity fluorine atoms. In an alternative embodiment, said fluorine-containing material comprise fluorocarbon, silane derives thereof, and a mixture thereof. Said fluorine-containing material includes but not limits to polyfluoroalkoxysilane (PFAS), perfluorononane (PFN), (heptadecafluoro-1,1,2,2-tetra-hydrodecyl) trimethoxysilane (PFDS), or a mixture thereof.

The procedure of providing said fluorine-containing layer 104 may comprise the following steps: obtaining a liquid by dissolving said fluorine-containing material in a solvent; and depositing said liquid on said hole transport layer 103. In a preferred embodiment, said liquid comprises: 0.01~10 volume percentage concentration of said fluorine-containing material; wherein said volume percentage concentration is based on the total volume of said solvent. In an alternative embodiment, said solvent is a polar organic solvent, a non-polar organic solvent or a bipolar organic solvent. In an alternative embodiment, said solvent comprises chlorobenzene, ethanol, water or a mixture thereof. In a preferred embodiment, said fluorine-containing layer 104 has a thickness of 0.1~20 nm.

In a preferred embodiment, after said fluorine-containing layer 104 is provided, a heating step is conducted to heat said fluorine-containing layer 104 at a temperature of 50~300° C. In a preferred embodiment, said fluorine-containing layer 104 is heated at a temperature of 50~300° C. for 30 sec~1 hour. Said heating step can be conducted by thermal treatment or microwave treatment.

In the embodiment showed in FIG. 1, said active layer 105 has a P-layer 105a and a N-layer 105b. Said P-layer may comprise a P-type material such as pentacene, rubrene, tetracene, phthalocyanine, derives thereof, or a mixture thereof. Said N-layer may comprise a N-type material such as C60, C70, derives thereof, or a mixture thereof. In a preferred embodiment, said P-layer is a pentacene layer and said N-layer is a C60 layer. In an alternative layer, said active layer 105 may be a single layer comprising a mixture of poly(3-hexylthiophene) (P3HT) and [6,6]-phenyl C61-butyric acid methyl ester (DCBM).

Said electron transport layer 106 may comprise materials such as bathocuproine (BCP), tris(8-hydroxy-quinolinato) aluminum (Alq3), or a mixture thereof. In a preferred embodiment, said electron transport layer 106 is a BCP layer.

Said cathode 107 may be made of metal such as aluminum (Al) or silver (Ag), conductive metal oxide or conductive polymer, or a mixture thereof. In a preferred embodiment, said cathode 107 is made of silver.

Example 1: Organic Solar Cell Preparation According to the Process of the Present Invention Pentacene-Based OSC All the chemicals were purchased from Aldrich. First of all, a glass substrate coated with indium tin oxide (ITO, the sheet resistance of 15Ω, Aldrich) was prepared. The ITO-coated glass was then cleaned and ultrasonicated in a detergent solution followed by sonication in acetone and isopropyl alcohol. Then a PEDOT:PSS layer of about 30 nm was deposited on said ITO-coated glass by spin-coating (5000 rpm for 30 sec) in aqueous solution.

Various concentrations of PFAS was dissolved in chlorobenzene to obtain fluorine-containing liquids having 0.1, 0.3, 0.5, 0.7, or 0.9% (v/v) of PFAS. Those fluorine-containing liquids were respectively spin-coated (5000 rpm for 30 sec) to obtain a fluorine-containing layer on top of the PEDOT:PSS layer, and subsequently annealed at various temperatures in air atmosphere. The concentration of PFAS was displayed based on the total volume of chlorobenzene, which was kept at volume 5% for the final OSC device fabrication.

After the fluorine-containing layer was deposited and heated, a pentacene layer was deposited under a thermal deposition system; wherein the source temperature was kept at about 230° C. under a basic pressure of approximately $10^{-6}$ torr, at a deposition rate of about 1.1 $\text{Ås}^{-1}$. The thickness of the pentacene layer was controlled at 40 nm by the duration of deposition.

In the next step, a 40 nm thick C60 layer was deposited by thermal evaporation, followed by 5 nm thick BCP coating on the top. Finally the fabrication of the pentacene/C60 bilayer solar cells was completed by evaporating a 100 nm thick Ag metallic top layer.

P3HT:PCBM-Based OSC

All layers were fabricated as mentioned in the above paragraphs except for the materials of said active layer and said fluorine-containing layer. The active layer of the P3HT:PCBM-based OSC in this example was made of poly(3-hexylthiophene) (P3HT) and [6,6]-phenyl C61-butyric acid methyl ester (DCBM). The fluorine-containing material used was (heptadecafluoro-1,1,2,2-tetra-hydrodecyl) trimethoxysilane (PFDS) or perfluorononane (PEN), which was prepared at the concentration of 0.1% (v/v) in the fluorine-containing liquid.

Example 2: Characterization of the Pentacene-Based Organic Solar Cell of the Present Invention Characterization of PEDOT:PSS Layer In this example, we investigated the surface properties of an unmodified PEDOT:PSS layer (PEDOT:PSS) and a PFAS-modified PEDOT:PSS layer (PEDOT:PSS/PFAS; PFAS 0.5 v/v %) according to example 1. The surface energy was evaluated by measuring the contact angles using two test liquids: water and diiodomethane ($CH_2I_2$). The surface roughness ($R_{rms}$) was evaluated by atomic force microscopy (AFM). The results are showed in the following Table 1. The $r_s^p$ and $r_s^d$ are the polar and dispersion components of the surface energy, respectively. The ($r_s^p + r_s^d$) is the total surface energy. $R_{rms}$ is the root-mean-square value of the surface roughness.

TABLE 1

Contact angle, surface energy, and surface roughness of PEDOT:PSS and PEDOT:PSS/PFAS layers

| Methods Terms | Contact angle | | Surface energy | | | AFM |
|---|---|---|---|---|---|---|
| | $CH_2I_2$ (°) | $H_2O$ (°) | $r_s^d$ (mJ/m²) | $r_s^p$ (mJ/m²) | $r_s^d + r_s^p$ | R r.m.s. (nm) |
| PEDOT:PSS | 36.32 | 34.71 | 34.46 | 27.98 | 62.44 | 1.541 |
| PEDOT:PSS/ PFAS | 96.29 | 118.29 | 0.90 | 8.58 | 9.48 | 1.496 |

The contact angle measurements listed in the above Table 1 show that the PFAS-modified PEDOT:PSS layer has a larger contact angle than the unmodified PEDOT:PSS layer, which indicate a clear reduction of the total surface energy and polar components of the PFAS-modified PEDOT:PSS layer. The AFM results corroborated with the contact angle measurements indicate that the PFAS modification results in hydrophobic characteristic (low surface energy) but has no effect on the surface roughness.

Characterization of Pentacene Layer

An atomic force microscopy observation was conducted to examine the topography of the pentacene layers of a convention OSC and an OSC with fluorine modification according to the present invention (PFAS 0.5 v/v %). FIGS. 2a~2d show the topography of a pentacene layer of different thickness deposited on PEDOT:PSS surface without fluorine modification; and FIGS. 2e~2h shows the topography of a pentacene layer of different thickness deposited on a fluorine-modified PEDOT:PSS surface according to the present invention.

Figure 3:
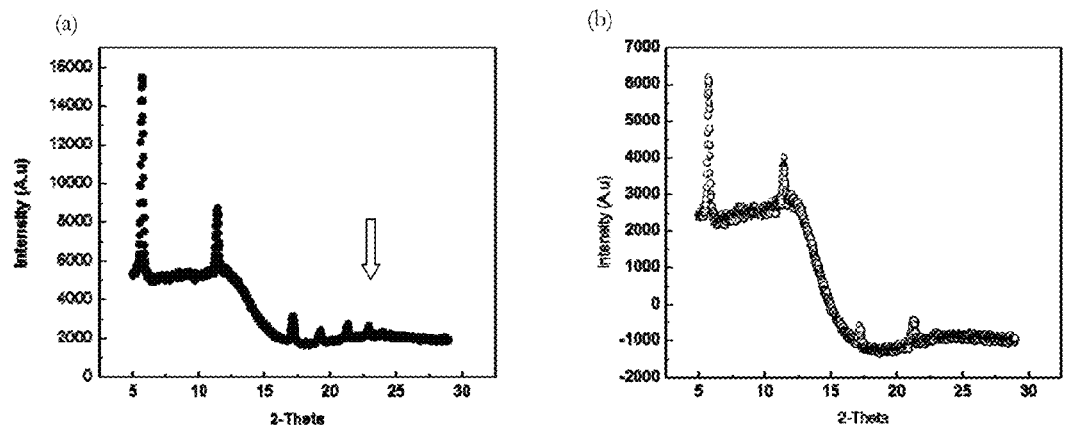
FIG. 3 show the XRD spectrums of a pentacene layer of a convention OSC structure (a) and a pentacene layer of an OSC structure according to the present invention (b).

The pentacene layer in a convention OSC configuration showed in FIGS. 2a~2d have dendritic crystalline domains and fiber-like grain (arrowed in the figure), which is called structural disorder. The structure disorder can be seen in the XRD spectrum of the pentacene layer (FIG. 3a). The arrowed peak in XRD spectrum of FIG. 3a represents the fiber-like grain structure in the pentacene layer of a convention OSC structure. In contrast, the pentacene layer in the OSC structure according to the present invention has an uniform crystallization without fiber-like grain (FIGS. 2e~2h). In addition, the peak representing fiber-like grain structure disappears in the XRD spectrum of FIG. 3b.

The aforesaid experimental data implies that the configuration of a fluorine-containing layer directly contacting with the PEDOT:PSS layer and the fluorine-containing layer improves the molecular orientation of the pentacene layer.

J-V Characteristics

Figure 4:
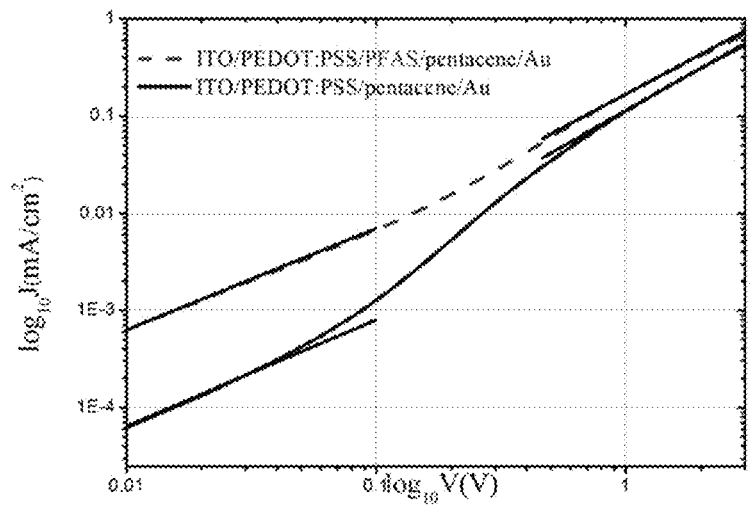
FIG. 4 shows the result of dark J-V measurement of a concentional OSC and an OSC according to the present invention.

In this experiment, a dark J-V measurement was conducted to examine the hole transporting property of a convention OSC and an OSC according to the present invention (PFAS 0.5 v/v %). FIG. 4 shows the representative J-V characteristic curves of both devices consisted of three main current-voltage response regions, namely, ohmic regime ($J \propto V$), space charge limited current (SCLC) region ($J \propto V^2$) and trap-filled region ($J \propto V^m$, m>2). It is found that the hole mobility values ($\mu_h$), evaluated using the Child's law in the SCLC region, increases upon the PFAS modification. The enhancement of hole mobility values is consistent with the highly textured pentacene layer deposited on the PEDOT:PSS/PFAS layer, as observed from the AFM studies (FIGS. 2e~2h). In other words, the PFAS modification results in molecular orientation improvement of the pentacene layer and thereby a better hole transporting property is obtained.

Figure 5:
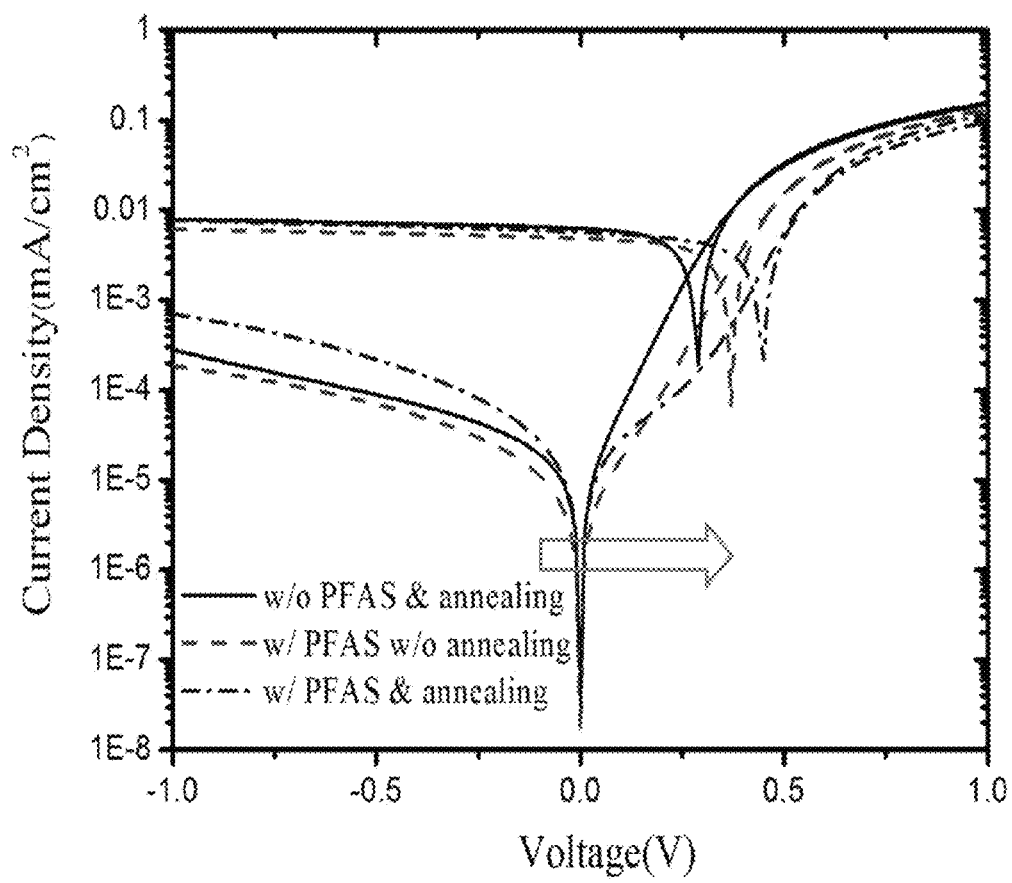
FIG. 5 reveals the built-in potential of a convention OSC and OSCs of the present invention with or without thermally annealing treatment.

Further investigation on the J-V characteristics, as illustrated in FIG. 5, also revealed that the incorporation of a PFAS layer in the OSC structure could lead to an increase in the built-in potential (Vbi) from 290 mV (for a convention OSC) to 370 mV (OSC according to the present invention with PFAS layer of 0.5 v/v %), or 450 mV (OSC according to the present invention with PFAS layer of 0.5 v/v % and thermally annealed at 200° C.).

The experiment also indicates that the thermal annealing treatment resulting in better built-in potential. It may be because the negative charges of —$CF^-$ functional groups at the interface between PEDOT:PSS/PFAS and pentacene layers would be rearranged and further distributed uniformly at the PEDOT:PSS/PFAS/pentacene interface during the thermal annealing treatment and thereby increases the internal electric field, and consequently improve the hole injection and electron blocking efficiency, hence the hole transporting competence.

To sum up the experiments conducted in this chapter, it is note that the PFAS-modification with/without the post-annealing treatment improves PCE as the increased hole transporting property (or charge separation ability), decreased leakage current and increased built-in potential.

Effects of PFAS Concentration and Annealing Temperature

In these experiments, we would like to examine the effects of PFAS concentration and temperature of the post-annealing treatment.

Figure 6A:
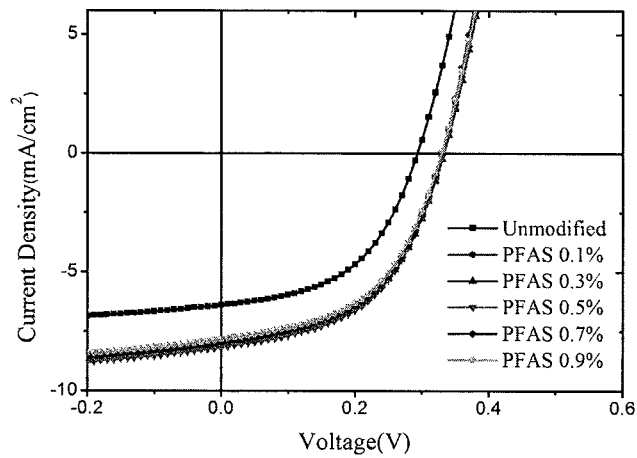
FIG. 6a shows the J-V characteristics of OSCs with various concentrations of PFAS according to the present invention.

As mentioned in the Example 1, OSCs with a fluorine-containing layer of various concentrations of PFAS (0.1, 0.3, 0.5, 0.7, or 0.9% (v/v)) were made. The J-V characteristics of those OSCs were shown in FIG. 6a and the results were further detailed in Table 2.

TABLE 2

Characteristics of OSCs modified with various concentration of PFAS

| Sample | Voc (V) | $J_{sc}$ (mA/cm²) | η (%) | FF (%) | Rs (Ω) | Rsh (kΩ) |
|---|---|---|---|---|---|---|
| Unmodified | 0.29 | 6.40 | 0.94 ± 0.03 | 50.5 | 95 | 0.9 |
| PFAS 0.1% | 0.33 | 7.97 | 1.34 ± 0.02 | 51.1 | 88 | 1.3 |
| PFAS 0.3% | 0.33 | 7.98 | 1.35 ± 0.08 | 51.3 | 93 | 1.3 |
| PFAS 0.5% | 0.33 | 8.19 | 1.38 ± 0.04 | 50.9 | 93 | 1.2 |
| PFAS 0.7% | 0.33 | 7.92 | 1.33 ± 0.04 | 51.1 | 85 | 1.3 |
| PFAS 0.9% | 0.33 | 7.84 | 1.31 ± 0.02 | 50.5 | 93 | 1.2 |

Interestingly, the power conversion efficiency (PCE) (η%) of the OSCs has been improved significantly from 0.94% to 1.38% upon the PFAS modification. Such enhancement (of ~46.8%) was contributed, as observed from Table 2, from the increase in the short-circuit current ($J_{sc}$) from 6.4 mA/cm$^2$ to 8.19 mA/cm$^2$, the open-circuit voltage ($V_{oc}$) from 0.29 V to 0.33 V, and the shunt resistance ($R_{sh}$) from 0.9 kΩ to 1.3 kΩ.

Figure 6B:
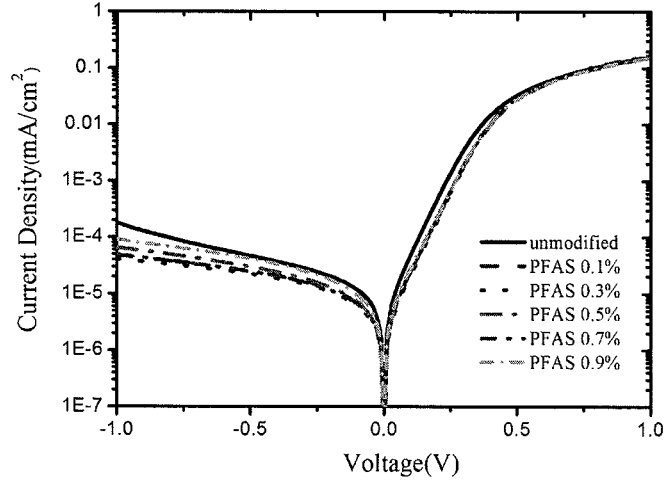
FIG. 6b shows the dark J-V characteristics of OSCs with various concentrations of PFAS according to the present invention.

As observed from the J-V measurements in the dark condition (FIG. 6b), the increase in $V_{oc}$ should be attributed to the suppression of leakage current induced by the insertion of PFAS layers. It is also noticed that the $J_{sc}$ first increases with increasing concentration of PFAS solutions but decreases again, indicating a maximum PCE of 1.38% for the OSCs with PFAS (0.5%) modified hole transport layer. The degradation of the device performance at higher concentration of PFAS layers could probably be attributed to the increase in barrier due to the increasing silane thickness.

Figure 6C:
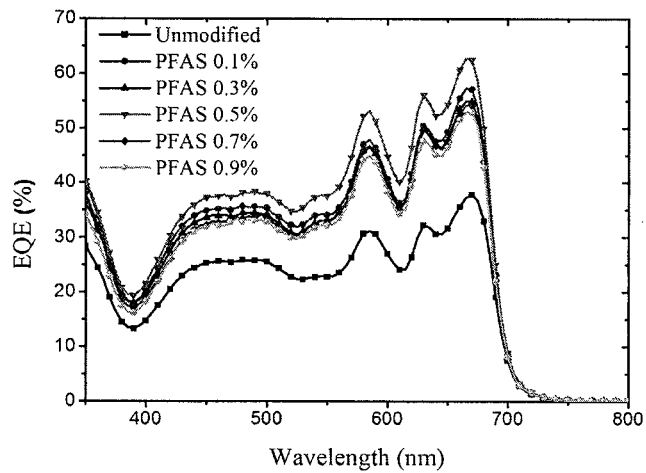
FIG. 6c shows the EQE spectra of OSCs with various concentrations of PFAS according to the present invention.

Although no obvious change in the absorption spectrum (data not shown) could be observed for PEAS-modified OSCs, the EQE spectra (FIG. 6c) exhibited significant difference between the OSCs with and without PFAS modification. The enhancement of the photocurrent upon the PFAS modification, as observed in FIG. 6b, should be attributed to the efficient charge separation phenomena. Inevitably, for the pentacene layer, deposited on the PFAS modified PEDOT:PSS substrate, the highly textured and vertically grown 3D crystalline domains with solely dendritic-like structure (without fiber-like grain) would possess high $\mu_h$, and hence could contribute to the significant enhancement in $R_{sh}$ and $J_{sc}$ values, indicating the improvement of the electron-hole separation efficiency.

On the other hand, the pentacene layer on PEDOT:PSS surface, without PFAS modification, has large grain sizes and less grain boundary defects but with high content of fiber-like disordered domains, giving rise to increased electron-hole recombination, and thus resulting in the decrease in $\mu_h$ and consequently to the loss in photocurrent.

In addition, as showed in FIG. 5, the PFAS modification with post-annealing treatment could provide even better built-in potential, which indicates a critical role of the post-thermally annealing treatment.

To investigate the influences of thermal annealing effect, the photovoltaic devices were subjected to the thermal treatment at varied temperature of 120, 150, 180 and 200° C. The post-annealing device performances were presented in FIGS. 7a (without PEAS-modification) and 7b (with PEAS-modification), which were further detailed in Table 3.

TABLE 3

Characteristic of OSC with PFAS modification and post-annealing treatment at various temperatures

| Sample | Voc (V) | $J_{sc}$ (mA/cm$^2$) | η (%) | FF (%) | Rs (Ω) | Rsh (kΩ) |
|---|---|---|---|---|---|---|
| Unanneal | 0.29 | 6.25 | 0.88 ± 0.03 | 48.8 | 96 | 0.9 |
|  | 0.34 | 7.71 | 1.33 ± 0.02 | 51.1 | 98 | 1.4 |
| 120° C. | 0.32 | 6.51 | 1.04 ± 0.08 | 50.2 | 95 | 1.2 |
|  | 0.36 | 8.09 | 1.55 ± 0.04 | 52.9 | 93 | 1.9 |
| 150° C. | 0.34 | 6.42 | 1.13 ± 0.02 | 51.9 | 92 | 1.8 |
|  | 0.39 | 8.01 | 1.65 ± 0.09 | 53.5 | 89 | 2.6 |
| 180° C. | 0.36 | 5.95 | 1.12 ± 0.09 | 52.3 | 95 | 2.5 |
|  | 0.42 | 7.70 | 1.73 ± 0.07 | 53.9 | 92 | 3.6 |
| 200° C. | 0.37 | 4.87 | 0.96 ± 0.04 | 53.2 | 96 | 3.6 |
|  | 0.45 | 6.28 | 1.47 ± 0.08 | 52.2 | 104 | 4.8 |

Figure 7:
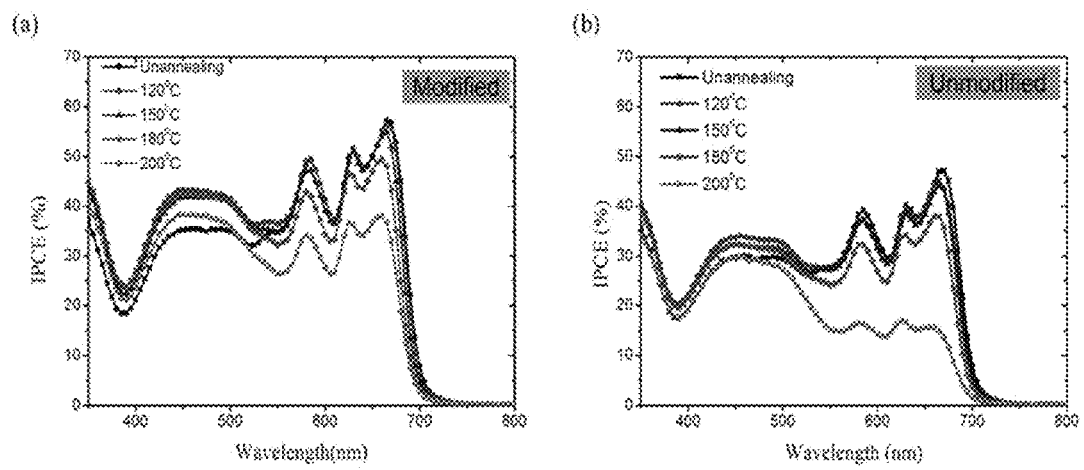
FIG. 7 displays the IPCE spectra of OSC without PFAS modification (a) or with PFAS modification (b) annealed at various temperatures.

For the standard device structures, the PCE could be improved from 0.88% to 1.13% (~28.5% enhancement), by thermal treatment (FIG. 7a). Such enhancement was mainly contributed by the increase in $V_{oc}$, $R_{sh}$, and $J_{sc}$ as found from Table 3. While, for the post-annealed PFAS modified OSCs, FIG. 7b exhibited that the PCE could be enhanced by 30% (from 1.33% to 1.73%) compared to the unannealed one. Notably, after thermal treatment, the PFAS modified photovoltaic cells could achieve a ~96.6% enhancement in PCE (1.73%) if compared to the unmodified standard OSCs (without thermal treatment, 0.88%).

The results (Table 3) showed that with increase in the annealing temperature, both the $V_{oc}$ and $R_{sh}$ increased significantly. The standard OSCs, without PFAS modification and without thermal annealing, exhibited the $V_{oc}$ value of 0.29 V only. However, after the insertion of PFAS layer followed by thermal annealing, the $V_{oc}$ increased up to 0.45 V. Similarly, the $R_{sh}$ is also significantly improved from 1.9 kΩ to 4.8 kΩ.

The experiment showed that the annealing treatment itself can improve the J-V characteristics of an OSC, but the annealing treatment after the PFAS-modification can result in even better performance for the OSC concerned.

Example 3: Anti-Moisture Characteristics of the P3HT:PCBM-Based Organic Solar Cell of the Present Invention In this example, the P3HT:PCBM based OSCs manufactured in the Example 1 were used to examine the anti-moisture characteristics provided by the fluorine-containing layer according to the present invention.

Figure 8:
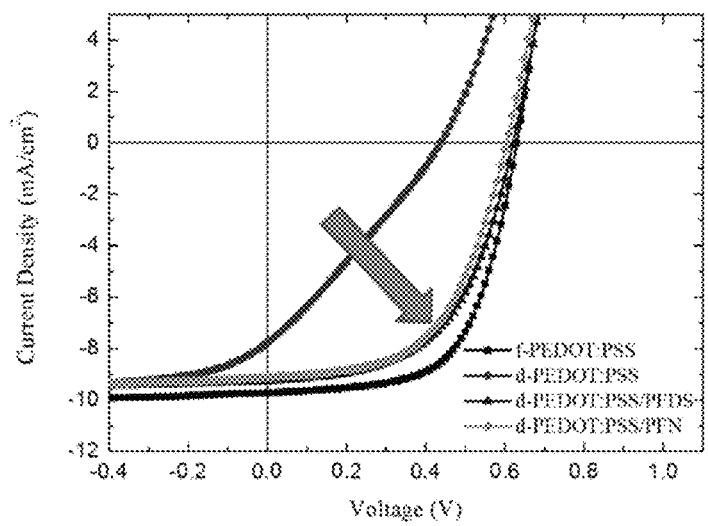
FIG. 8 shows J-V curves of samples A~D of Example 3 of the present invention.

Four different OSC configurations were used in this example for examining the anti-moisture characteristics; that is: fresh PEDOT:PSS (Sample A); moisture-degraded PEDOT:PSS (Sample B); moisture-degraded PEDOT:PSS with 0.1% (v/v) PFDS (Sample C); and moisture-degraded PEDOT:PSS with 0.1% (v/v) PFN (Sample D). Sample A was used as a positive control and sample B was a negative control. The experimental results were showed in FIG. 8 and Table 4.

It is shown that sample B with degraded PEDOT:PSS shows S-shape J-V characteristics and the efficiency thereof dramatically decreases about one quarter, corresponding to the $V_{oc}$ from 0.63 to 0.45 V and $J_{sc}$ from 9.79 to 7.90 mA/cm$^2$. Whereas, both sample C and sample D show about three times enhancement compared to the sample B, corresponding to improve efficiency from 0.98% to 3.12% and 3.04%.

Remarkably, this is the first demonstration that an S-shape J-V curve can be recovered back near to its normal state. Based on the results, we should notice here that the S-shape recovery ability of PFDS and PFN is almost comparable.

TABLE 4

The J-V characteristics of samples A~D of Example 3

| Condition | $V_{oc}$ (V) | $J_{sc}$ (mA/cm$^2$) | FF (%) | PCE (%) | $R_{sh}$ (Ω*cm$^2$) | $R_s$ (Ω*cm$^2$) |
|---|---|---|---|---|---|---|
| Sample A | 0.63 | 9.79 | 62.25 | 3.86 | 139.92 | 19.16 |
| Sample B | 0.45 | 7.90 | 27.69 | 0.98 | 359.85 | 1.42 |
| Sample C | 0.62 | 9.39 | 53.40 | 3.12 | 189.77 | 7.87 |
| Sample D | 0.61 | 9.12 | 55.08 | 3.04 | 180.05 | 9.58 |

Figure 9:
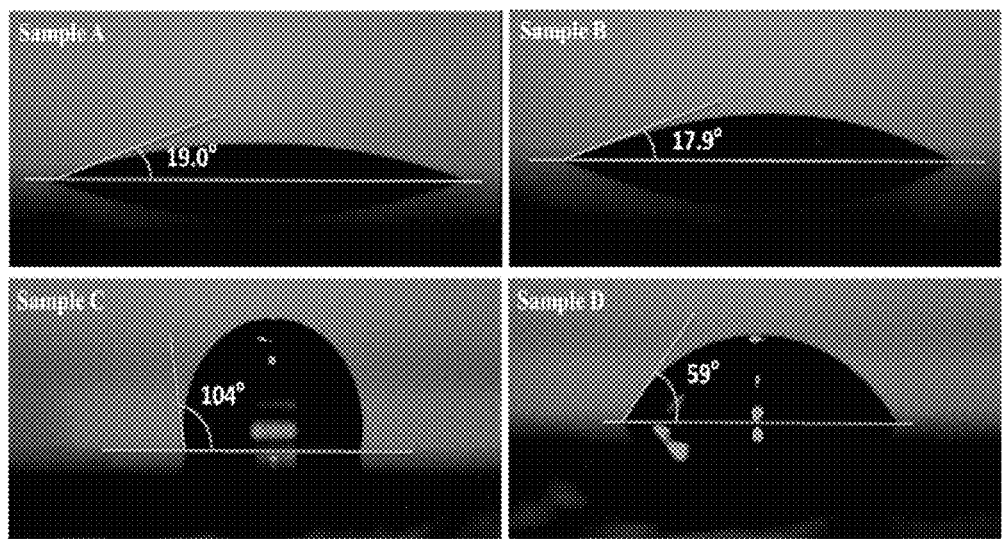
FIG. 9 shows water contact angle measurement of samples A~D of Example 3 of the present invention.

In addition, a water contact angle measurement was also conducted for the aforesaid four samples. The result was showed in FIG. 9. Sample C and sample D have contact angles of 104° and 59°, respectively; whereas sample A and sample B have contact angles of 19.0° and 17.9°, respectively. As mentioned in the Example 2, the bigger contact angle represents larger hydrophobic property, lower surface energy, less structural disorder in active layer, and thereby better performance of the OSC concerned.

Furthermore, the conductivity of samples A to D was measured by four-point probe technique. Sample A shows the best conductivity of $5.17 \times 10^{-2}$ S cm$^{-1}$ with the least air-exposed time, but the conductivity of sample B has greatly reduced to $3.27 \times 10^{-5}$ S cm$^{-1}$. However, if treating PEDOT:PSS with PFDS or PFN (sample C or sample D), the conductivity can be recovered back by almost two order of magnitude larger to $1.34 \times 10^{-3}$ S cm$^{-1}$ and $1.37 \times 10^{-3}$ S cm$^{-1}$, respectively.

The above experiments prove that the configuration of a fluorine-containing layer according to the present invention can recover the moisture-degraded PEDOT:PSS layers to a normal state.

As the fluorine-containing layer can recover the moisture-degraded PEDOT:PSS layer to a normal state, it is expected that an OSC with the configuration of a fluorine-containing layer shall have a longer lifetime as the potential moisture damage is prevented. We further examined the lifetime of sample A and sample D to prove our hypothesis.

Figure 10A:
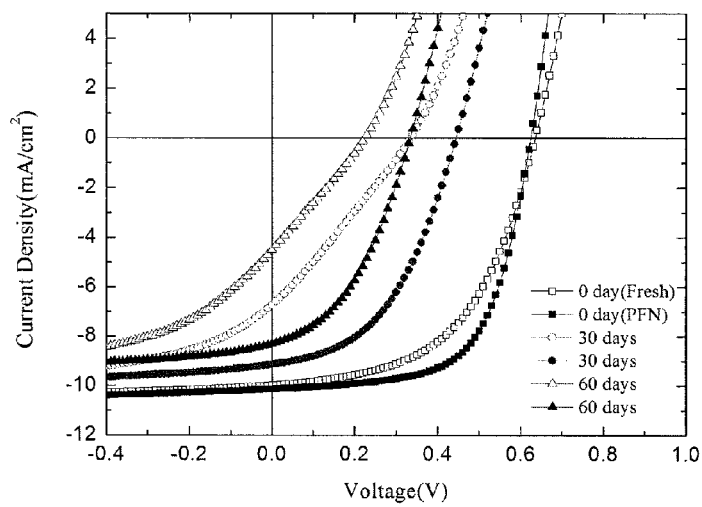
FIG. 10(a) shows J-V curves of samples A and D at various time intervals of air exposure.
Figure 10B:
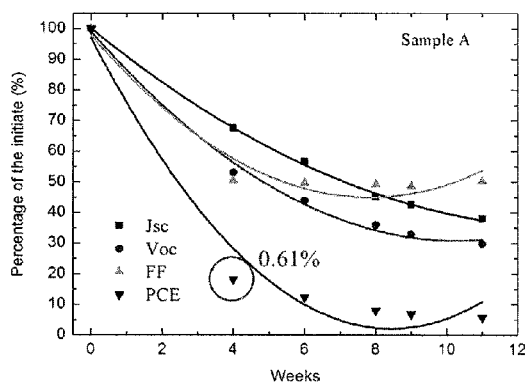
FIGS. 10(b) and (c) shows J-V characteristics of samples A and D, respectively.
Figure 10C:
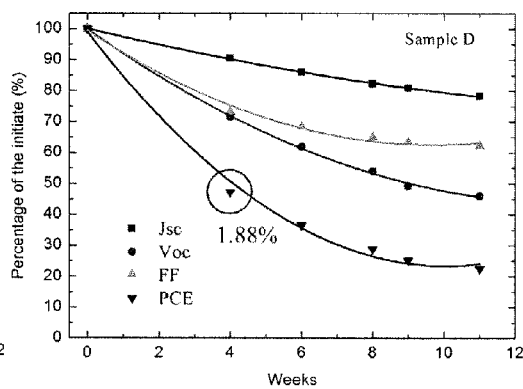

Sample A and sample D were exposed to atmospheric air for different times. The illuminated J-V characteristics of the OSCs exposed to atmospheric air for different times is shown in FIG. 10(*a*), and the FIGS. 10(*b*) and (*c*) show the influence of the duration time of the devices on all parameters of PCE, $J_{sc}$, $V_{oc}$ and FF.

The performance of sample D is better than sample A for the same time intervals of air exposure. When the samples were exposed to air for 60 days, a PCE of 1.88% was recorded for sample D, but the PCE of sample A was 0.61%. This result shows that the formation of hydrophobic layer on the PEDOT:PSS surface may protect PEDOT:PSS from water deterioration, which is propitious to improve the stability of OSC.

The above experiment proves our hypothesis that the anti-moisture property of the fluorine-containing layer according to present invention results in longer lifetime of an OSC concerned.

What claims is:

1. An electronic device, comprising electric-connected layers in order:
   a first electrode; a hole transport layer;
   a fluorine-containing layer, which is deposited directly on said hole transport layer; an active layer, which is deposited directly on said fluorine-containing layer, an electron transport layer; and a second electrode; wherein said hole transport layer has a surface energy of 7-65 mJ/m$^2$.

2. The electronic device according to claim 1, wherein said fluorine-containing layer comprises fluorocarbon, silane derives thereof, or a mixture thereof.

3. The electronic device according to claim 1, which is manufactured by the process comprising the following steps:
   providing a substrate coated with a conductive material as a first electrode;
   providing a hole transport layer on said substrate;
   providing a fluorine-containing layer directly on said hole transport layer;
   providing an active layer directly on said fluorine-containing layer;
   providing an electron transport layer on said active layer; and
   providing a second electrode on said electron transport layer.

4. The electronic device according to claim 3, which is manufactured by the process further comprising a heating step of heating said fluorine-containing layer at a temperature of 50~300° C.

5. The electronic device according to claim 1, which is a solar cell, a thin film transistor, or a light emitting diode.

6. The electronic device according to claim 1, which has an open-circuit voltage (Voc) of 0.2~0.8 V.

7. The electronic device according to claim 1, wherein said active layer comprises a mixture of poly(3-hexylthiophene) and [6,6]-phenyl C61-butyric acid methyl ester.

8. The electronic device according to claim 1, wherein said active layer comprises a P-layer and a N-layer; wherein said P-layer directly contacts with said fluorine-containing layer.

9. The electronic device according to claim 8, wherein said P-layer is a pentacene layer.

10. The electronic device according to claim 9, wherein said pentacene layer has no fiber-like grain.

11. The electronic device according to claim 8, wherein said N-layer is a C60 layer.

12. The electronic device according to claim 9, wherein said pentacene layer has a diffraction pattern as shown in FIG. 3*b*.

* * * * *